(12) United States Patent
Fribley et al.

(10) Patent No.: US 10,190,925 B2
(45) Date of Patent: Jan. 29, 2019

(54) LOW COST OVERMOLDED LEADFRAME FORCE SENSOR WITH MULTIPLE MOUNTING POSITIONS

(71) Applicant: Honeywell International Inc., Morris Plains, NJ (US)

(72) Inventors: Josh M. Fribley, Columbus, OH (US); Lamar Floyd Ricks, Lewis Center, OH (US); Richard Wade, Worthington, OH (US); Jim Machir, Columbus, OH (US); Richard Alan Davis, Plano, TX (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/212,906

(22) Filed: Jul. 18, 2016

(65) Prior Publication Data

US 2018/0017449 A1    Jan. 18, 2018

(51) Int. Cl.
   *G01L 1/18*    (2006.01)
   *B81B 7/00*    (2006.01)
   *B81C 1/00*    (2006.01)

(52) U.S. Cl.
   CPC ............... *G01L 1/18* (2013.01); *B81B 7/007* (2013.01); *B81B 7/0058* (2013.01); *B81C 1/00301* (2013.01)

(58) Field of Classification Search
   CPC .......................................................... G01L 1/18
   USPC .................... 73/862.637; 361/679.08–679.17
   See application file for complete search history.

(56) References Cited

U.S. PATENT DOCUMENTS

| | | | |
|---|---|---|---|
| 7,726,197 B2 * | 6/2010 | Selvan | G01L 1/18 73/777 |
| 8,091,436 B2 | 1/2012 | Eckhardt et al. | |
| 8,316,725 B2 * | 11/2012 | Wade | G01L 1/18 73/760 |
| 2005/0186710 A1 * | 8/2005 | Moyer | G06F 3/03543 438/116 |
| 2007/0245836 A1 * | 10/2007 | Vaganov | G01L 1/044 73/862.621 |
| 2010/0100052 A1 * | 4/2010 | Eckhardt | A61M 5/14 604/181 |
| 2013/0247689 A1 * | 9/2013 | Thanigachalam | G01L 9/0054 73/862.627 |
| 2013/0247690 A1 * | 9/2013 | Wade | G01L 9/0052 73/862.632 |
| 2013/0298688 A1 * | 11/2013 | Wade | G01L 1/18 73/766 |
| 2014/0083209 A1 | 3/2014 | Wade et al. | |

(Continued)

FOREIGN PATENT DOCUMENTS

| EP | 2466284 A1 * | 6/2012 | ............... G01L 1/18 |
|---|---|---|---|
| EP | 2693184 A2 * | 2/2014 | ............. G01L 19/14 |

*Primary Examiner* — Lisa Caputo
*Assistant Examiner* — Jamel Williams
(74) *Attorney, Agent, or Firm* — Seager Tufte & Wickhem LLP

(57) ABSTRACT

A force sensor includes a leadframe comprising a plurality of electrically conductive leads, a sense die coupled to the leadframe, and an encapsulant disposed over at least a portion of the leadframe and the sense die. The sense die is electrically coupled to the plurality of leads, and the plurality of leads extends from the encapsulant.

17 Claims, 9 Drawing Sheets

(56) References Cited

U.S. PATENT DOCUMENTS

2015/0128729 A1* 5/2015 Wade ................. G01L 1/18
　　　　　　　　　　　　　　　　　73/862.632
2017/0292884 A1* 10/2017 Ching, Jr. ............ G01L 9/0042

* cited by examiner

LOW COST OVERMOLDED LEADFRAME FORCE SENSOR WITH MULTIPLE MOUNTING POSITIONS

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Force sensors are often used to sense an external force applied to the sensors and provide an output signal representative of the applied force. Such sensors can be used in a wide variety of applications, including medical applications. Force sensors are also commonly used in non-medical applications, such as industrial and commercial applications as well as other applications.

SUMMARY

In an embodiment, a force sensor includes a leadframe comprising a plurality of electrically conductive leads, a sense die coupled to the leadframe, and an encapsulant disposed over at least a portion of the leadframe and the sense die. The sense die is electrically coupled to the plurality of leads, and the plurality of leads extends from the encapsulant.

In an embodiment, a force sensor comprises a sense die comprising a first side and a second side, a first actuation element disposed in contact with the first side of the sense die, and a second actuation element disposed in contact with the second side of the sense die. The first actuation element comprises a mechanical coupling element configured to mechanically couple an external force with the sense die, and the second actuation element comprises a gel.

In an embodiment, a method comprises disposing a sense die on a leadframe, electrically coupling the sense die to the plurality of electrically conductive leads, and molding an encapsulant over at least a portion of the leadframe and the sense die. The leadframe comprises a plurality of electrically conductive leads.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment, and may be included in more than one embodiment of the present systems and methods (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Disclosed herein are force sensors having a sense die coupled to a leadframe. An encapsulant can be molded over a portion of the leadframe and sense die to protect any wire bonds and retain the sense die in position. The sense die can be coupled to an external force or pressure using two coupling mechanisms. First, a mechanical coupling element, such as a ball bearing, can be used with one side of the sense die, and second, a gel or other transmission media can be used with the other side of the sense die. Leads can extend from the leadframe, and the resulting force sensor can then be customized for a wide range of uses. In some embodiments, the sense die can comprise a slab die in which the height of the sense die is substantially uniform across the sense die. This may provide a less expensive sense die as compared to etched dies with a diaphragm formed by the etching. Thus, the force sensors described herein can provide a low-cost and highly flexible platform for providing a force sensor to a wide variety of end products or uses.

Figure 1A:
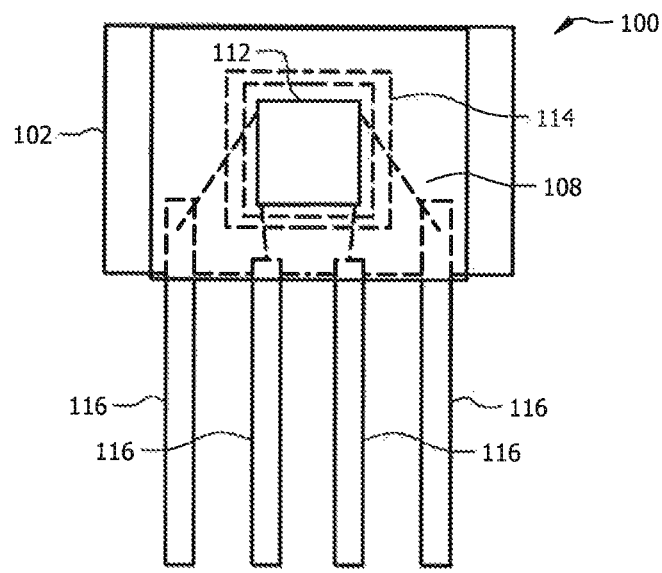
FIGS. 1A-1C illustrate top, side cross-section, and bottom views, respectively, of an embodiment of a force sensor according to an embodiment.
Figure 1B:
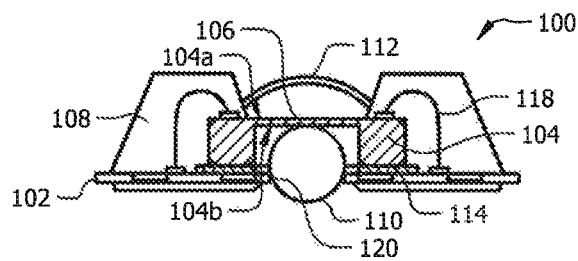
Figure 1C:
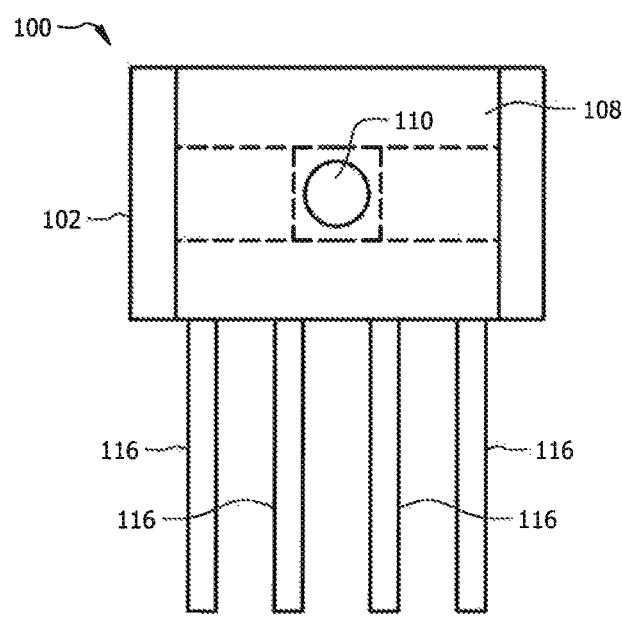

FIGS. 1A-1C illustrate an embodiment of a force sensor 100 according to some embodiments. As shown, the force sensor 100 can include a leadframe 102, a sensor element or sense die 104 having a sense diaphragm 106, a first actuation element 110, and a second actuation element 112. An encapsulant 108 can be overmolded on at least a portion of the leadframe 102 and the sense die 104. The force sensor 100 may have a top side 104a and a bottom side 104b (see FIG. 1B), and the sense die 104 can be mounted on the leadframe 102 using an adhesive 114, solder, or the like. A plurality of electrical connections or leads 116 can be electrically coupled through the leadframe 102, through one or more bonds, such as wire bonds 118, to the sense die 104.

The force sensor 100 may be formed around a leadframe 102. The leadframe 102 can comprise a base material and one or more conductive traces that are electrically coupled to a plurality of output leads 116, which serve to allow for an electrical coupling to an external component. The base material may be electrically insulating to prevent conduction between the leads and conductive traces on the base material, in some aspects, the base material can comprise a polymeric material, a ceramic, or the like. No matter the material of construction, the leadframe 102 comprises a plurality of output connector pins or leads 116, which may be used to connect the force sensor 100 to an external device or system. The leads 116 comprise an electrically conductive material for conducting a signal between the sense die 104 and an external electrical connection. In some embodiments, the leads 116 can comprise gold, copper, aluminum, tin, silver, platinum, or any other suitably conductive material. The electrical traces, or other suitable means, may allow for electrically coupling the sense die 104 and any other circuitry present to each other and to the output leads 116. The depicted leadframe 102 shown in FIGS. 1A-1C is commonly referred to as a single in-line package (SIP), as the leads 116 only extend from one side of the leadframe 102. Other configurations, such as a dual in-line package (DIP) in which the leads extend from at least two sides of the leadframe 102, are also possible. In some embodiments, the leadframe may also comprise a surface mount technology (SMT) device.

In some embodiments, the sensing diaphragm 104 may be fabricated on the sense die 104 by back-side etching a silicon die (e.g., with a KOH etching technique, deep reactive ion etching, or other etching technique), however, it is contemplated that any suitable process may be used, as desired. The sense diaphragm 106 may have a height or thickness that is less than the thickness of the edges of the sense die 104, thereby forming the sense diaphragm 106.

In some aspects, sense diaphragm 106 may comprise a center projection or boss extending from the top side 104a and/or the bottom side 104b. The projection or boss may be integrally formed with sense diaphragm 106, or may be attached to sense diaphragm 106 after forming sense diaphragm 106. The projection or boss may serve to contact the first actuation element 110 and/or the second actuation element 112, thereby providing a force contact point to provide a more consistent and repeatable measurement of the force on the sense die 104. In some aspects, the boss may have any shape configured to, for example, reduce wear to sense diaphragm 106 due to movement of the first actuation element 110 and/or the second actuation element 112 when it contacts sense diaphragm 106, allow for higher force and higher pressure applications, and/or facilitate a linear relationship between a force applied to the boss and an output of force sensor 100.

The sense die 104 may have one or more sensing elements disposed on or adjacent to the sense diaphragm 106, such as piezoresistive sensing elements or components formed using suitable fabrication or printing techniques. In some cases, the one or more sensing elements may be formed for sensing a deflection of the sense diaphragm 106 in response to an applied force.

When utilized, the piezoresistive components may be secured relative to the sense diaphragm 106 and/or formed on or as part of the sense diaphragm 106. The piezoresistive components may be configured to have an electrical resistance that varies according to an applied mechanical stress (e.g., deflection of sense diaphragm 106), In some aspects, the piezoresistive components may include a silicon piezoresistive material, however, it is contemplated that non-silicon materials may be used, as desired. The piezoresistive components may be connected in a Wheatstone bridge configuration (e.g., a full or half bridge configuration). It is to be understood that the piezoresistive components are only one example of a sensing element that can be used, and it is contemplated that any other suitable sensing elements may be used in place of or in addition to the piezoresistive components.

The sense die 104 can be coupled to the leadframe 102 using an adhesive 114, such as a RTV, a silicone-epoxy, a soft epoxy, or a regular or hard epoxy. The adhesive 114 may include a conductive adhesive, a nonconductive adhesive, or a combination of conductive and nonconductive adhesives. Any suitable conductive adhesive and nonconductive adhesive may be used. One example nonconductive adhesive is RTV6424, which is available from Momentive Performance Materials Inc. of Waterford, N.Y. One example conductive adhesive may be SDC5000, which is available from Momentive Performance Materials Inc. of Waterford, N.Y. These are just examples, and it is contemplated that any other suitable conductive and/or nonconductive adhesive may be used, as desired. In some aspects, it is contemplated that the sense die 104 may be mounted to the substrate 102 using any other suitable bonding mechanism (e.g., solder, eutectic, ball-grid array (BGA), etc.).

The sensing elements can be electrically coupled to one or more conductive traces on. the leadframe 102 using wire bonds 118. The wire bonds 118 may couple the sensing elements on the top side 104a of the sense die 104 to the conductive traces on the leadframe 102. When additional circuitry is not present, the conductive traces on the leadframe 102 may be directly coupled to the leads 116.

In some cases, the sense die 104 may be mounted over an opening 120 in the leadframe 102 that is sized to allow an actuation element 110 to be inserted between the sense diaphragm 106 and the leadframe 102. Depending on the type of actuation element 110 used, the opening 120 can be sized to allow the actuation element 110 to be snap fitted into position. In this embodiment, the opening 120 in the leadframe 102 may be sized slightly smaller than the diameter or other dimension of the actuation element 110 so that the insertion of the actuation element 110 through the opening 120 partially, elastically deforms the leadframe 102. The leadframe 102 may then retain the actuation element 110 between the leadframe 102 and the sense diaphragm 106 during use.

In order to protect the leadframe and the wire bonds 118 as well as providing structural rigidity and retaining the sense die 104 in place, an overmolding operation can be used to dispose em encapsulant 108 about the leadframe 102 and sense die 104. The overmolding operation generally entails disposing a die or housing around the leadframe 102 and sense die 104 after the sense die 104 is electrically coupled to the leadframe 102 and injection molding the encapsulant 108 into the die or housing. Once set, the housing or die can be removed to leave the encapsulant 108 disposed or molded over the leadframe 102 and sense die 104. Alternatively, a deposition process can be used to dispose the encapsulant 108 on one or more surfaces of the force sensor 100.

Various types of materials can be used as an encapsulant 108, depending on the type of environment in which the force sensor 100 will be placed into service. In some aspects, a thermoplastic material can be used as the encapsulant material. For example, the thermoplastic encapsulant can comprise polyetherimide (PEI). In some embodiments, a thermoset, such as an epoxy or resin, can be used as the encapsulant composition.

The encapsulant 108 can be formed on both sides of the force sensor 100. On a first side, the encapsulant 108 can overlap the sense die 104 to retain the sense die 104 in position relative to the leadframe 102. A height of encapsulant 108 may be sufficient to fully cover or enclose the wire bonds and the edges of the sense die 104, where the height refers to the dimension that is perpendicular to the planar surface of the leadframe 102. In some embodiments, the encapsulant 108 may have an overall height (taking into account both sides of the leadframe 102) that is between about 1.5 to about 10 times the height of the sense die 104. In the embodiment illustrated in FIGS. 1A-1C, the overall height of the encapsulant 108 (including both sides of the leadframe 102 and including the leadframe 102 and the sense die 104) can be between about 750 micrometers (μm) to about 1,000 μm.

The sense diaphragm 106 can be left uncovered to allow a pressure or other force to be transferred to the sense diaphragm 106. In some embodiments, the encapsulant 108 can be formed with sides sloping inwards towards a center of the sense die 104. Such a configuration may allow a pressure or force transmitted by the second actuation element 112 to be transmitted and/or concentrated on the sense diaphragm 106.

The first actuation element 110 and the second actuation element 112 serve to transfer a force imposed upon the actuation elements 110, 112 to the sense diaphragm 106 to allow the force to be measured. In order to provide a flexible force sensor 100 that can be used in a variety of end assemblies and products, the first actuation element 110 can comprise a mechanical coupling between an exterior force and the sense diaphragm 106, while the second actuation element 112 may comprise a gel or flexible polymeric material suitable for protecting the sense diaphragm as well as transmitting a pressure to the sense diaphragm 106. The force sensor 100 can then be used in a variety of different applications by coupling the first actuation element 110 or the second actuation element 112 to the desired force to be measured as appropriate for the application.

In some aspects, the first actuation element 110 can comprise a mechanical actuation element configured to transfer a force to the sense diaphragm 106. In some embodiments, the first actuation element 110 may include a spherical object (such as the sphere shown in FIG. 1B), a pin, an extender, a button, any other activation device, and/or a combination thereof. It may be appreciated that other types of actuators may be utilized, such as, for example, slidable mounted plungers or shafts, point of contact type components other than spherical objects, "T"-shaped transfer mechanisms, in accordance with alternative embodiments. If desired, only a portion of an outer surface of the first actuation element 110 may be spherical in shape or take on a particular shape. The first actuation element 110 may be made of any material. For example, the first actuation element 110 may be formed from stainless steel, a polymer, a ceramic, jeweled, other suitable metal, and/or other suitable material. In some cases, the first actuation element 110 may include a stainless steel ball bearing. It is contemplated, however, that other generally spherical and other shaped elements may be used as or as part of the first actuation element 110, if desired, including polymer-based objects.

The second actuation element 112 can comprise a force transfer material, such as a gel. The gel can be disposed in the cavity formed by the encapsulant 108 and substantially fill the area above and in contact with the sense diaphragm 106. As a result, the gel can substantially surround a top 104*a* of the sense die 104 and contact the sides of the encapsulant 108. This may provide protection and media isolation of the sense die 104 from an external environment adjacent the force sensor 100. The gel may fluidly communicate an externally-applied force to the sense diaphragm 106. Any externally applied force can then be transmitted through the gel to the sense diaphragm 106, where the force can be measured based on the deflection of the sense diaphragm 106. In some embodiments, the gel can comprise any suitable material for transferring a force or pressure through the gel to the sense diaphragm, such as silicone gel.

The deflection resulting from a force applied on either the first actuation element 110, the second actuation element 112, or both (e.g., to provide a differential force), may generally result in the deflection of the sense die 104. The sensing elements may be configured to detect a deflection that is predominantly in a direction perpendicular to the plane of the sense diaphragm 106 and/or to the plane of the sense die 104 as a whole. In this sense, the force sensor 100 is configured to measure a uniaxial force that is provided normal to the plane of the leadframe 102.

While illustrated in FIG. 1B as having a height less than that of the encapsulant 108, the second actuation element 112 can be disposed in the opening of the encapsulant 108 to a level above or below the height of the encapsulant 108, such that the surface of the gel can be below the level of the encapsulant or above the level of the encapsulant 108. Further, while the surface of the second actuation element 112 is shown as being circular or spherical, the surface can also be any other suitable shape.

In operation, when a current is applied to the piezoresistive sensing elements (e.g., arranged in a full or half Wheatstone bridge configuration), an electrical output signal may be generated that is related to the degree of deflection of the sense diaphragm 106, and thus the force applied to the force sensor 100. The force can be transferred by the first actuation element 110 or the second actuation element 112 (for a unidirectional force), or from both the first actuation element 110 and the second actuation element 112 (for a differential force measurement). In any configuration, a resulting deflection of the sense diaphragm 106 can change the resistance of the sensing elements. The resulting output voltage can then be detected on the leads 116 that are electrically coupled to the sense die 104, or alternatively the output voltage can be processed using various circuitry that is part of the force sensor 100, as described in more detail herein.

Figure 2A:
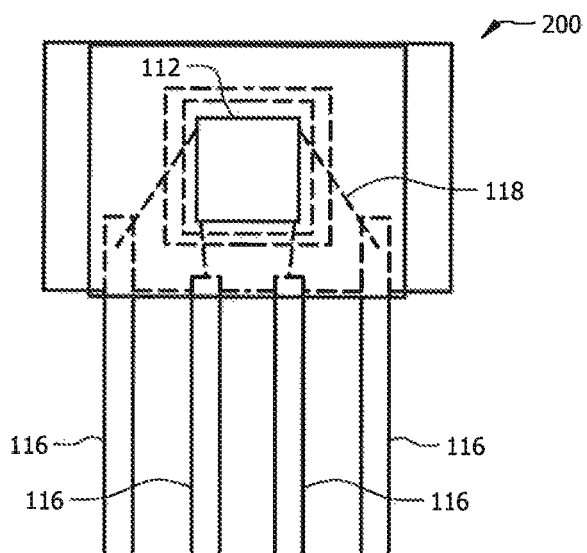
FIGS. 2A-2C illustrate top, side cross-section, and bottom views, respectively, of another embodiment of a force sensor according to an embodiment.
Figure 2B:
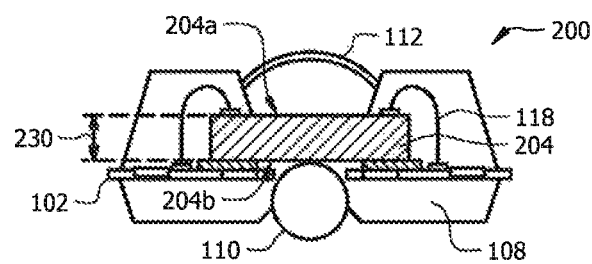
Figure 2C:
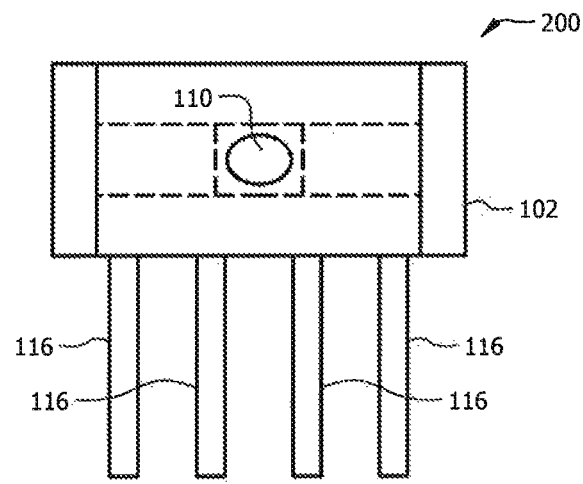

In order to provide flexibility in the manufacturing process, a variety of types of sense dies can be used with the force sensors disclosed herein. For example, another embodiment of a force sensor 200 is illustrated in FIGS. 2A-2C. The force sensor 200 is similar to the force sensor 100 illustrated and described with respect to FIGS. 1A-1C, and similar components will not be described in the interest of brevity. As shown, the force sensor 200 can include a leadframe 102, a sensor element or sense die 204, a first actuation element 110, and a second actuation element 112. Each component can be the same or similar to those described with respect to FIGS. IA-1C with the exception of the sense die 204.

The sense die 204 as shown in FIG. 2B can comprise a slab type sense die. In this embodiment, the sense die 204 may be formed with a relatively uniform height 230 across the sense die 204. For example, the sense die 204 may have a substantially constant height 230 across the sense die 204. In some aspects, the sense die 204 may not have a diaphragm, and rather the entire sense die 204 can be the same height and represent a diaphragm. Since the sense die 204 is coupled to the leadframe 102 and retained by the encapsulant 108, the sense die 204 may be formed thinner than the sense die 104 of FIGS. 1A-1C, In an embodiment, the sense die 204 may have a height 230 of between about 50 microns to about 500 microns, where a thicker sense die 204 may be used to detect a higher force. In some embodiments, the sense die 204 can be used to detect forces between about 1 Newton (N) to about 100 N or between about 5 N to about 50 N.

The sense die 204 may have one or more sensing elements disposed on or adjacent to an upper surface 204a or a lower surface 204b of the sense die 204. The sense die 204 can be electrically coupled to the leadframe 102 using one or more wire bonds 118 as described herein. In operation, the sense die 204 can operate in the same way as the sense die 104 described with respect to FIGS. 1A-1C, where the sense die 204 can deflect across the portion of the sense die 204 exposed to the force rather than just across a diaphragm. The sense die 204 may otherwise be the same or similar to the sense die described in FIGS. 1A-1C.

The use of the slab die may allow for a relatively low cost and easily manufactured sense die 204. For example, the use of the sense die 204 may avoid the need for an etching step to form a diaphragm for sensing a force. Further, the use of a relatively thin sense die 204 may be enabled by the use of the encapsulant 108 to retain the sense die 204 in position relative to the leadframe 102, where the encapsulant serves to protect and retain the sense die 204 during use.

Figure 3A:
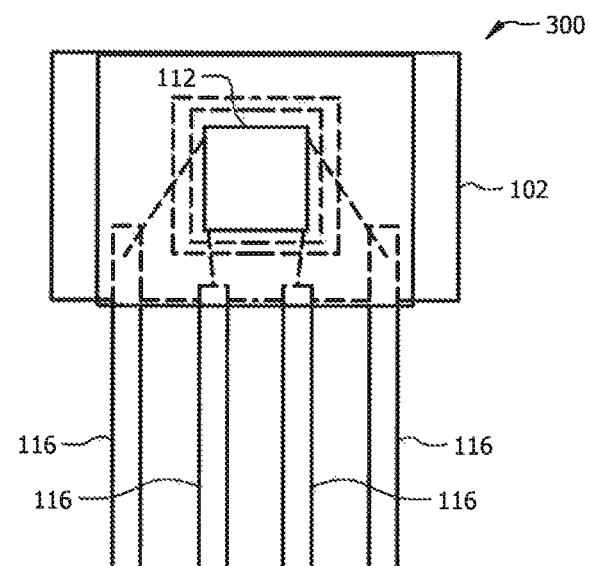
FIGS. 3A-3C illustrate top, side cross-section, and bottom views, respectively, of still another embodiment of a force sensor according to an embodiment.
Figure 3B:
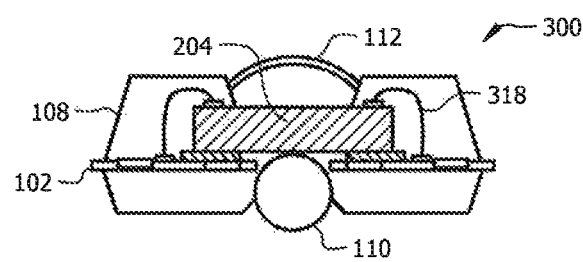
Figure 3C:
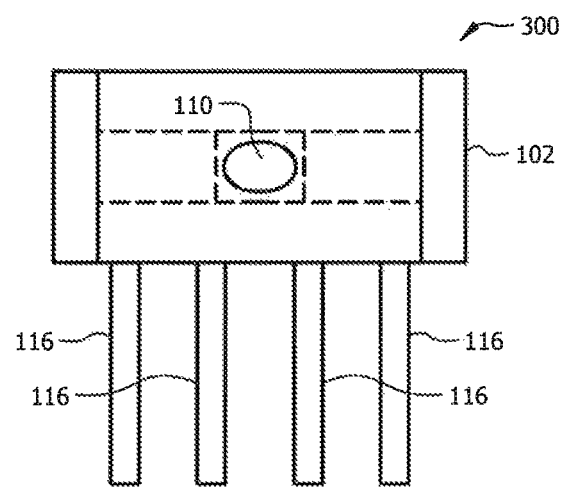

A low-profile force sensor 300 can be formed to provide a thinner package. For example, another embodiment of a force sensor 300 is illustrated in FIGS. 3A-3C. The force sensor 300 is similar to the force sensor 100 illustrated and described with respect to FIGS. 1A-1C and the force sensor 200 described with respect to FIGS. 2A-2C. Similar components will not be described in the interest of brevity. As shown, the force sensor 300 can include a leadframe 102, a sensor element or sense die 204, a first actuation element 110, and a second actuation element 112. Each component can be the same or similar to those described with respect to FIGS. 1A-1C and/or with respect to FIGS. 2A-2C. While a slab type sense die 204 is shown in FIG. 3B, a diaphragm type sense die could also be used.

As shown in FIG. 3B, one or more sensing elements on the sense die 204 can be electrically coupled to the leadframe 102 using one or more wire bonds 318. Since the encapsulant 108 can be disposed to fully cover the wire bonds 318, the wire bonds 318 can comprise reverse geometry wire bonds to reduce the overall height of the wire bonds. The resulting height of the encapsulant can then be reduced to provide an overall thinner package. The use of the reverse geometry wire bonds 318 may provide a force sensor 300 having an overall height (taking into account both sides of the leadframe 102) that is between about 1.5 to about 5 times the height of the sense die 204. In the embodiment illustrated in FIGS. 3A-3C, the overall height of the encapsulant 108 (including both sides of the leadframe 102 and including the leadframe 102 and the sense die 104) can be between about 350 micrometers (μm) to about 500 μm, and can represent a low-profile design. In some embodiments, the second actuation element 112 can extend beyond a surface of the encapsulant 108 in a low-profile design, though this is not necessary.

Figure 4A:
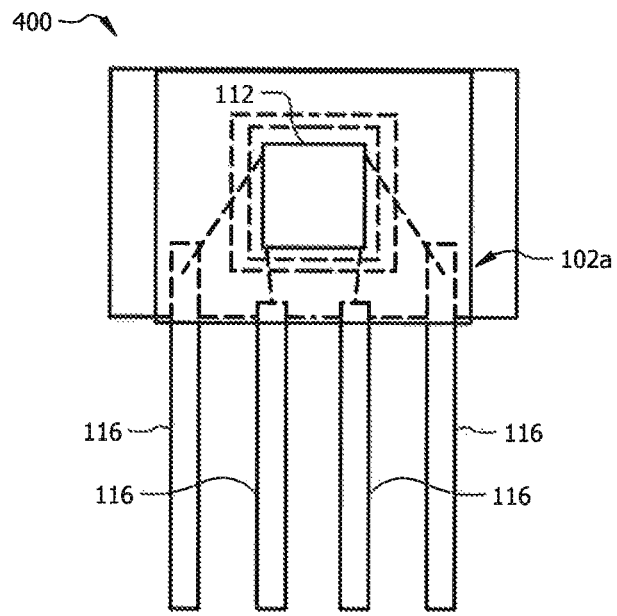
FIGS. 4A-4C illustrate top, side cross-section, and bottom views, respectively, of yet another embodiment of a force sensor according to an embodiment.
Figure 4B:
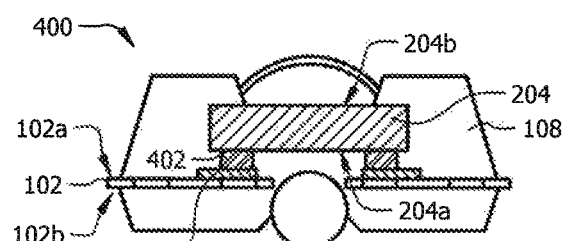
Figure 4C:
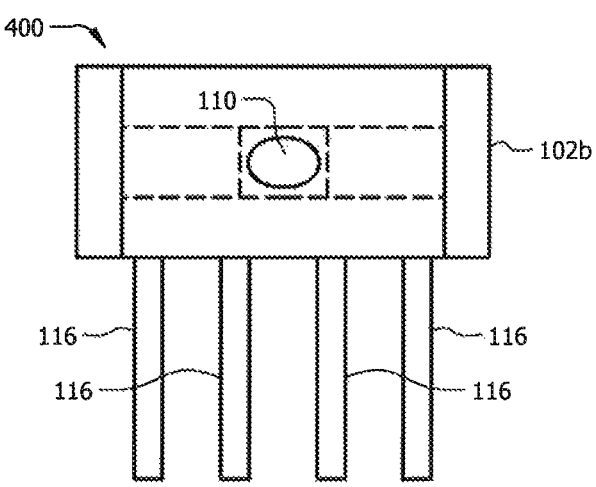

In some embodiments, a low-profile design can be obtained by flip-chip mounting the sense die 204 to the leadframe 102. The force sensor 400 is similar to the force sensors 100, 200, and 300 illustrated and described with respect to FIGS. 1A-3C. Similar components will not be described in the interest of brevity. As shown in FIGS. 4A-4C, the sense die 204 may be flip chip mounted to leadframe 102, using an adhesive 114 (e.g., a conductive adhesive) as a bonding material. In other words, the top side 204a of the sense die 204 (e.g., the side of the sense die 204 with the sensing elements) can face downward (e.g., "downward" is with respect to the orientation shown in FIG. 4B) toward a first side 102a (e.g., "top side" is with respect to the orientation shown in FIG. 4B) of the leadframe 102, and mounted thereto with a conductive material, such as a conductive adhesive 114. In this example, the adhesive 114 may be configured to electrically connect bond pads on the sense die 204 to one or more bond pads or trace conductors on the leadframe 102 without the need for wire bonds. In addition, or in the alternative, the sense die 204 may be flip chip mounted to the leadframe 102 using bump bonds, a solder ball grid array (BGA), or any other suitable technique, as desired. Various techniques, such as thermosonic welding, thermo-compression welding, or other suitable techniques can be used to couple the conductive die attach to the sense die 204 and the conductive traces on the leadframe 102.

For flip-chip mounted sense dies 204, the encapsulant 108 may encapsulate the conductive die attach to protect and isolate the die attach from the environment during use. Since the sense die 204 can be coupled to the leadframe 102 in the flip-chip mounted embodiment, the overall height of the encapsulant 108 may be relatively thin.

The sense die 204 can be directly coupled to the leads on the leadframe to provide a direct output from the sensing elements (e.g., piezoresistive sensing elements) on the. sense die to the leads. Such a configuration may provide an uncompensated output from the force sensor. In some embodiments, compensation and/or processing circuitry can be provided on the leadframe 102. In these embodiments, the outputs from the sensing elements on the sense die may be coupled to the processing circuitry using one or more conductive traces, and the processing circuitry can then be coupled to the leads to provide a desired output.

Figure 5A:
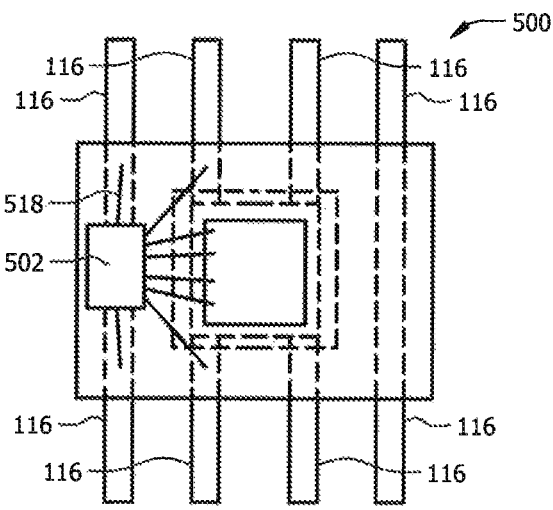
FIGS. 5A-5C illustrate top, side cross-section, and bottom views, respectively, of another embodiment of a force sensor according to an embodiment.
Figure 5B:
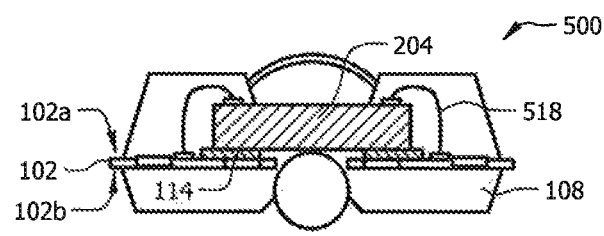
Figure 5C:
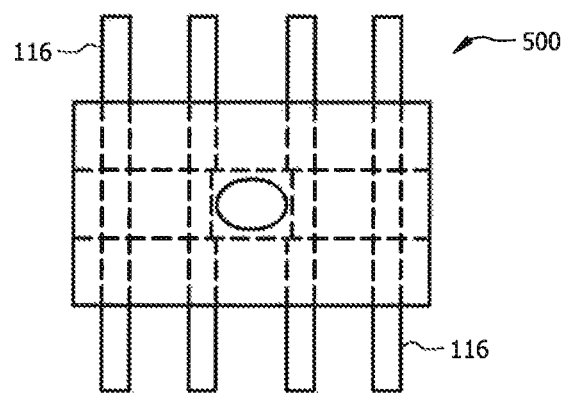

As shown in FIGS. 5A-5C, processing circuitry 502 can be coupled to the leadframe 102 for processing the output of the sensing elements on the sense die 204. In some embodiments, the circuitry 502 may be mounted on the leadframe 102 (e.g., on first side 102a or second side 102b of the leadframe 102). In some embodiments, the processing circuitry 502 can be disposed on the same side as the sense die 204 to simplify the electrical connections and produce a low-profile force sensor 500.

While various processing circuitry 502 can be used in some aspects, the processing circuitry 502 may include a microprocessor, a microcontroller, an application specific integrated circuit ("ASIC"), and/or an application specific standard product ("ASSP"). In some embodiments, processing circuitry 502 may be mounted to the leadframe 102 using an adhesive or any other suitable bonding mechanism (e.g., solder, eutectic, etc.), including any of those materials discussed with respect to the adhesive 114 (e.g., conductive adhesives, non-conductive adhesives, etc.). As shown, the processing circuitry 502 may be electrically connected to sense die 204 via trace conductors on the leadframe 102, and in some cases, via bond pads and/or terminals using wire bonds 518. In some embodiments, it is contemplated that processing circuitry 502 may be electrically connected to the sense die 204 in other ways, including direct die-to-die wire bonds.

The processing circuitry 502 may include circuitry that receives an output signal from the sense die 204, and in response may generate an output signal whose magnitude is representative of a magnitude of the force applied to the sense die 204. The processing circuitry 502 may condition the output signal of the sense die to correct for repeatable variations, such as offset, sensitivity, non-linearity, temperature effects, and/or other variations, and/or amplify (e.g., convert the output signal from a millivolt output to a voltage output), or convert the output signal (e.g., analog to digital conversions, etc.). The processing circuitry 502 may condition the output signal to compensate for temperature-dependent variations in the electrical characteristics and/or to account for a nonlinear relationship between changes in the electrical characteristic and corresponding changes in the magnitude of the force. In some embodiments, the processing circuitry 502 can comprise a digital to analog converter (DAC) to provide a digital output from the force sensor 500.

In some embodiments, the processing circuitry 502 can comprise an ASIC. The ASIC may be configured as a digital amplifier with a built in temperature sensor for compensating temperature induced changes of the sense die 204 output signal caused by temperature affecting the operating characteristics of the force sensor 500 components.

It can be seen that the embodiment of FIGS. 5A-5C is a DIP package comprising a plurality of leads 116. While the embodiments of FIGS. 1A-4C have been illustrated as SIP packages, any of the embodiments described herein can comprise DIP packages. Further, while described in terms of certain components such as the sense die 204, the processing circuitry 502 and corresponding configurations can be used with any of the embodiments described with respect to FIGS. 1A-4C.

The resulting force sensors described herein may each have one or more leads 116 extending from the encapsulant 108. The leads can be configured to be bent or otherwise shaped to provide for a desired mounting position. Thus, the overall force sensor package may provide a flexible package framework for further installing the force sensors into a desired end use.

Figure 6A:
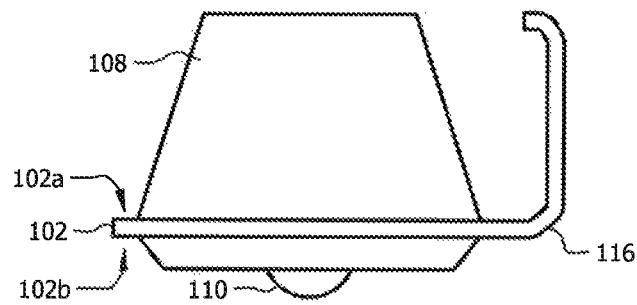
FIGS. 6A-6C illustrate cross-section views of embodiments of lead configurations for a force sensor.
Figure 6B:
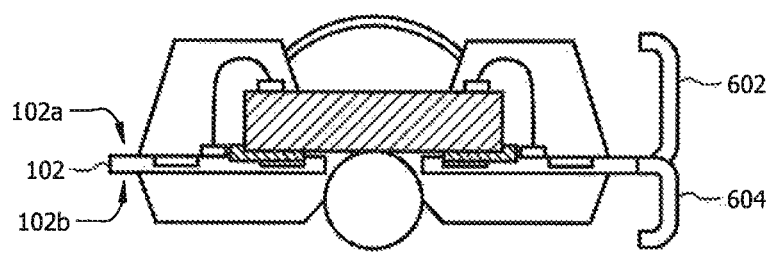
Figure 6C:
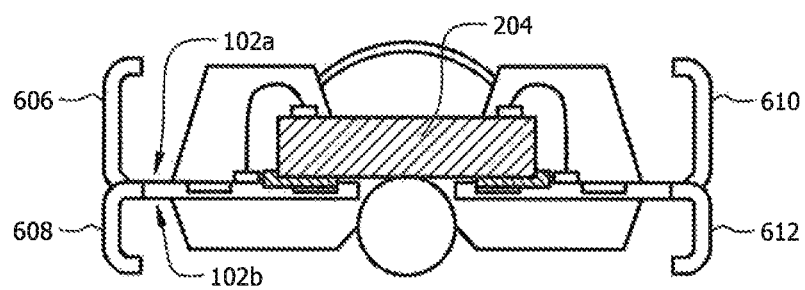

Various lead configurations and patterns are shown with respect to FIGS. 6A-6C. The lead configurations shown in FIGS. 6A-6C can apply to any of the force sensors described with respect to FIGS. 1A-5C. FIG. 6A illustrates a side view of a SIP having at least one lead 116 bent to provide a connection with an external component. As shown, the lead 116 can be bent towards the first side 102a of the leadframe 102. In some embodiments, the lead 116 can also be bent towards the second side 102b of the leadframe 102. The ability to manufacture a force sensor package having straight leads 116 and then bend or otherwise configure the leads to a desired orientation ay allow the first action element or the second actuation element to be selectively aligned with an input force in a particular use.

FIG. 6B illustrates a side-view of a SIP having a plurality of leads 116 bent in different directions. As shown, a first lead 602 can be bent towards the first side 102a of the leadframe 102, while a second lead 604 can be bent towards a second side 102b of the leadframe 102. As further illustrated, the first lead 602 can be shaped to have a longer vertical (e.g., where vertical refers to the orientation shown in FIG. 6B) portion than the second lead 604. In some embodiments, any individual lead can be shaped to have any desired length. The leads can be trimmed as needed to have the desired length. While shown as having different lengths, any of the leads 602, 604 can have the same length and be shaped and bent in the same or different directions. For example, a third or fourth lead could be bent in the same direction as the first lead 602 while having the same or a different length.

FIG. 6C illustrates another side-view of DIP force sensor having a plurality of leads 606, 608, 610, 612. As shown, the DIP package may provide leads on both sides of the sense die 204 extending from both ends of the leadframe 102. As illustrated, the plurality of leads 606, 608, 610, 612 can all be shaped and bent in different directions. In some embodiments, the leads 606, 608 on a first end of the leadframe 102 can both be bent in the same direction, the leads 610, 612 on a second end opposite the first end can be bent in the same or different directions. When the leads 606, 608 are bent in the same direction, the leads 610, 612 on the second end can be bent in the same direction as the leads 606, 608 or in the opposite direction. As further shown in FIG. 6C, one or more of the plurality of leads 606, 608, 610, 612 can have a different length than the other leads.

Figure 7A:
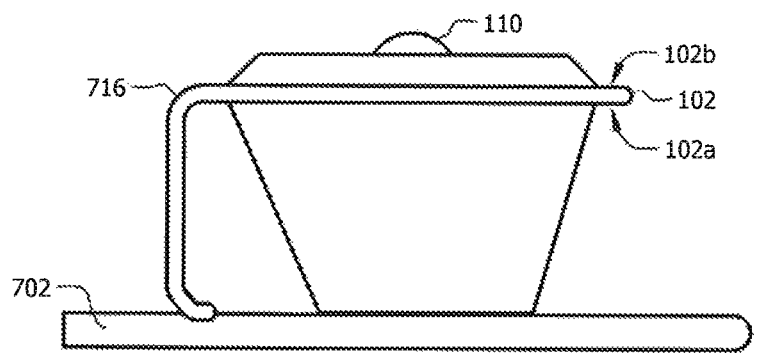
FIGS. 7A-7C illustrate cross-section views of embodiments of mounting configurations for a force sensor on a substrate.
Figure 7B:
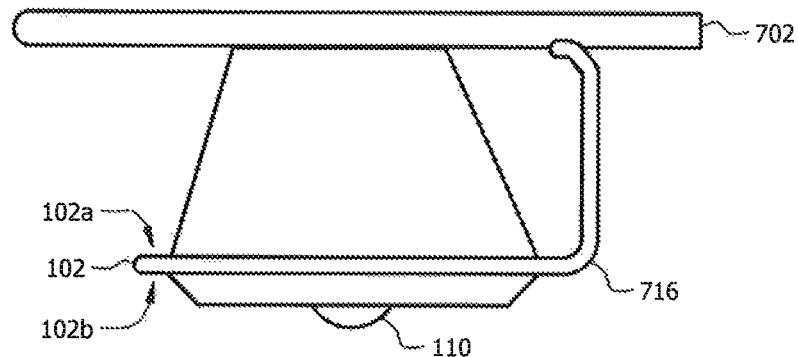
Figure 7C:
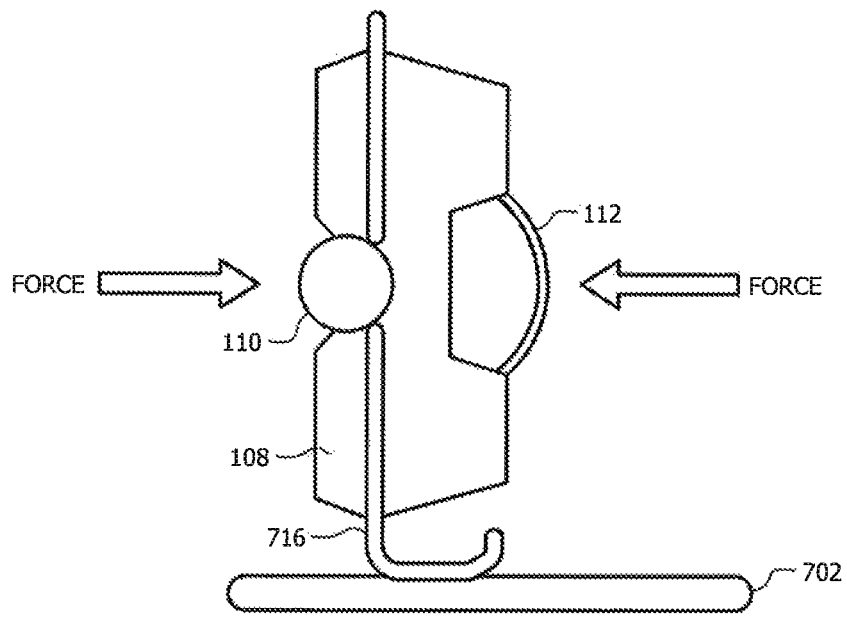

The ability to shape and bend the leads into a variety of patterns using SIP or DIP force sensors may allow the resulting force sensor packages to be mounted to a substrate in a variety of orientations. FIGS. 7A-7C illustrate several orientations for a SIP package on a substrate. The force sensor orientations shown in FIGS. 7A-7C can apply to any of the force sensors described with respect to FIGS. 1A-5C, and the orientations can rely on or be enabled by the various lead configurations shown in FIGS. 6A-6C.

The substrate 702 can comprise any suitable element, such as a PCB, ceramic substrate, or the like, and generally represents a larger instrument package that is configured to be electrically connected to the force sensor for detecting a force. As shown in FIG. 7A, the force sensor can be mounted on the substrate 702 with the lead 716 being bent down towards the first side 102a of the leadframe 102 and contacting the substrate 702. In some embodiments, the lead 716 can be bonded to a bond pad or conductive trace on the substrate 702 to form an electrical connection for relaying a sensor output. While only one lead 716 is shown, a plurality of leads would be similarly coupled to bond pads or conductive traces on the substrate 702. As illustrated, the first side 102a of the leadframe 102 would be placed facing the substrate 702, and the first actuation element 110 would be exposed to allow a force to be detected. While shown with the first actuation element 110 being positioned away from the substrate 702, the second actuation element could alternatively be arranged to face away from the substrate 702 by bending the lead 716 in the opposite direction. Thus, the force sensor is flexible in the orientation in which it is coupled to the substrate 702.

FIG. 7B is similar to the orientation shown in FIG. 7A, except that the force sensor can be bonded to an opposite surface of the substrate 702. In this orientation, the first actuation element 110 is disposed facing way from the substrate 702 to allow a force to be detected through the first actuation element 110. As noted above, the second actuation element could also be positioned facing away from the substrate 702 by bending the lead 716 in the opposite direction.

FIG. 7C illustrates a perpendicular orientation of the force sensor. In this embodiment, the lead 716 can be coupled to the substrate 702 such that the plane of the sense die in the force sensor is perpendicular to the plane of the substrate 702. In this orientation, both the first actuation element 110 and the second actuation element 112 are exposed and available for detecting a force. One or both of the actuation elements 110, 112 can then be used to detect a force or a differential force across the force sensor.

In some embodiments, the substrate can comprise a port or opening 802 in the substrate to allow for the force sensor to be coupled to the substrate 702 while providing access to the first actuation element 110 and/or the second actuation element 112. FIGS. 8A-8D illustrate several orientations for a SIP and DIP force sensor package on a substrate 702. The force sensor orientations shown in FIGS. 8A-8D can apply to any of the force sensors described with respect to FIGS. 1A-5C, and the orientations can rely on or be enabled by the various lead configurations shown in FIGS. 6A-6C.

Figure 8A:
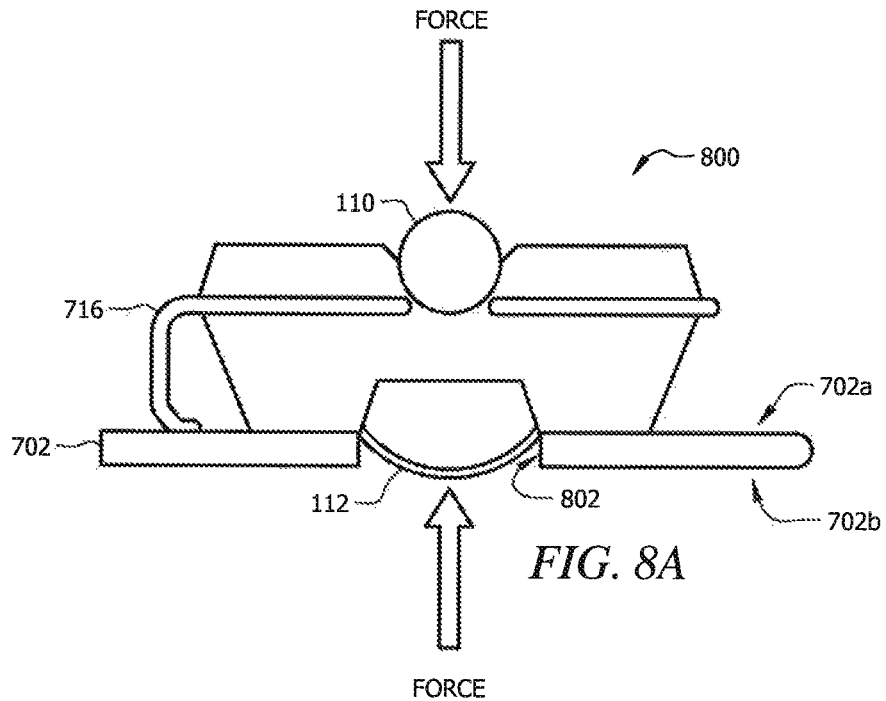
FIGS. 8A-SD illustrate cross section views of embodiments of mounting configurations for a force sensor on a substrate having an opening.

FIG. 8A illustrates a force sensor 800, which can be the same or similar to any of the force sensors 100, 200, 300, 400, or 500 described herein, coupled to a substrate 702, where the substrate 702 has a port 802. The port 802 can be sized to allow the first actuation element 110 or the second actuation element 112 to be accessed. As shown in FIG. 8A, the port 802 can provide access to the second actuation element 112 through the substrate 702 from a second side 702b of the substrate. The first actuation element 110 can then face away from the substrate 702 and can be accessed from a first side 702a of the substrate 702. In this configuration, the first actuation element 110 and/or the second actuation element 112 can be accessed to provide a signal indicative of a force on the force sensor 800.

Figure 8B:
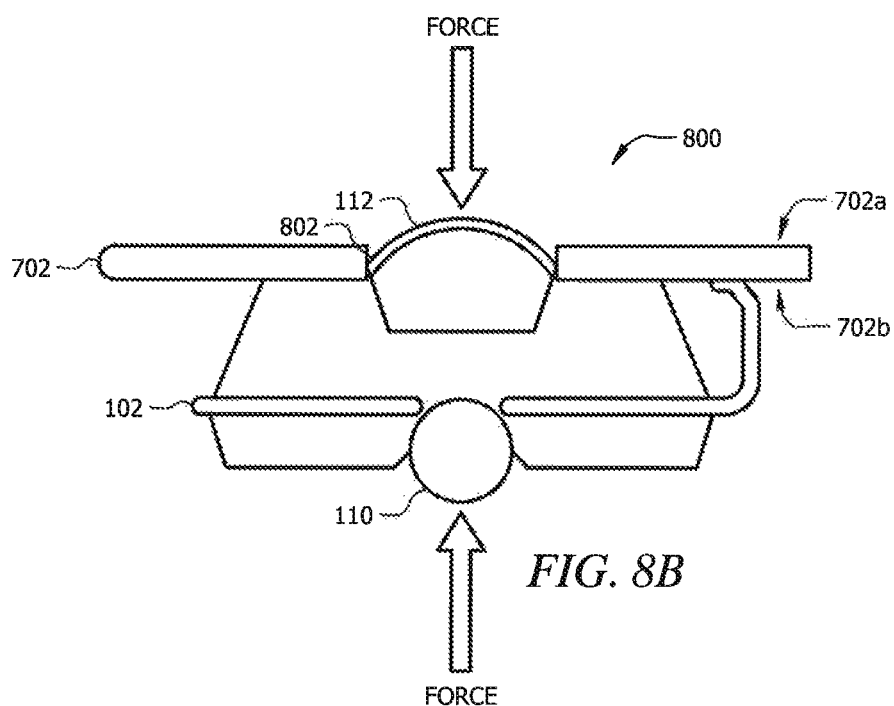

FIG. 8B illustrates a similar orientation in which the force sensor 800 is disposed on the second side 702b of the substrate 702. In this orientation, the port 802 can provide access to the second actuation element 112 through the substrate 702 from a first side 702a of the substrate 702, The first actuation element 110 can then face away from the substrate 702 and can be accessed from a second side 702b of the substrate 702. In this configuration, the first actuation element 110 and/or the second actuation element 112 can be accessed to provide a signal indicative of a force on the force sensor 800.

Figure 8C:
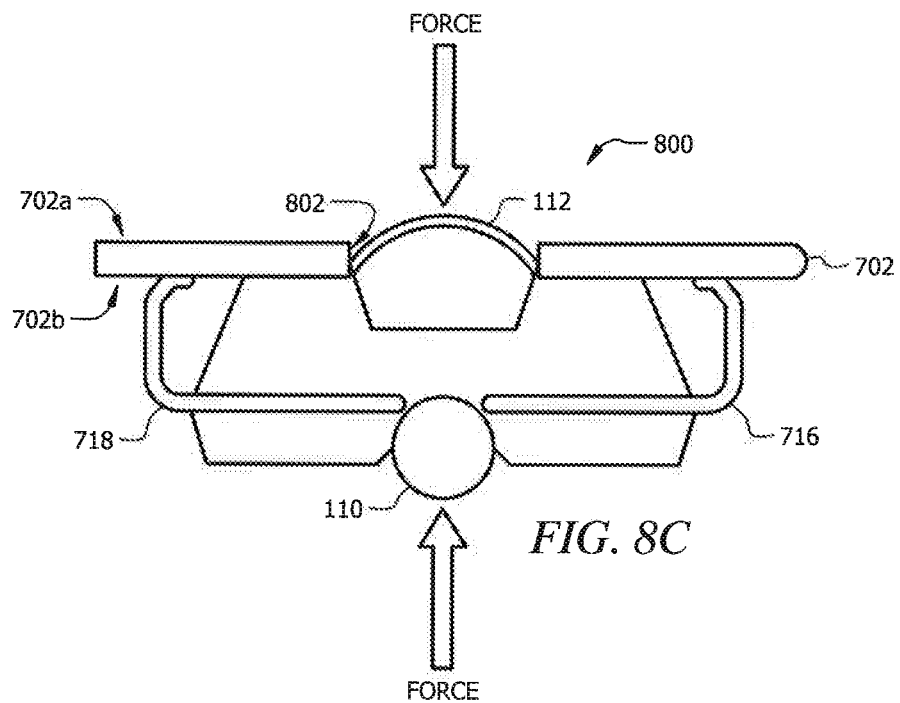

FIG. 8C illustrates a DIP package with the force sensor 800 coupled to the substrate 702. The port 802 in the substrate 702 can be aligned with the second actuation element 112 to provide access to the second actuation element 112 from the first side 702a of the substrate 702.

The leads 716, 718 can be shaped to contact the substrate 702 to provide an electrical connection between the substrate 702 and the force sensor 800. The first actuation element 110 can face away from the substrate to provide access to the first actuation element from the second side 702b of the substrate.

Figure 8D:
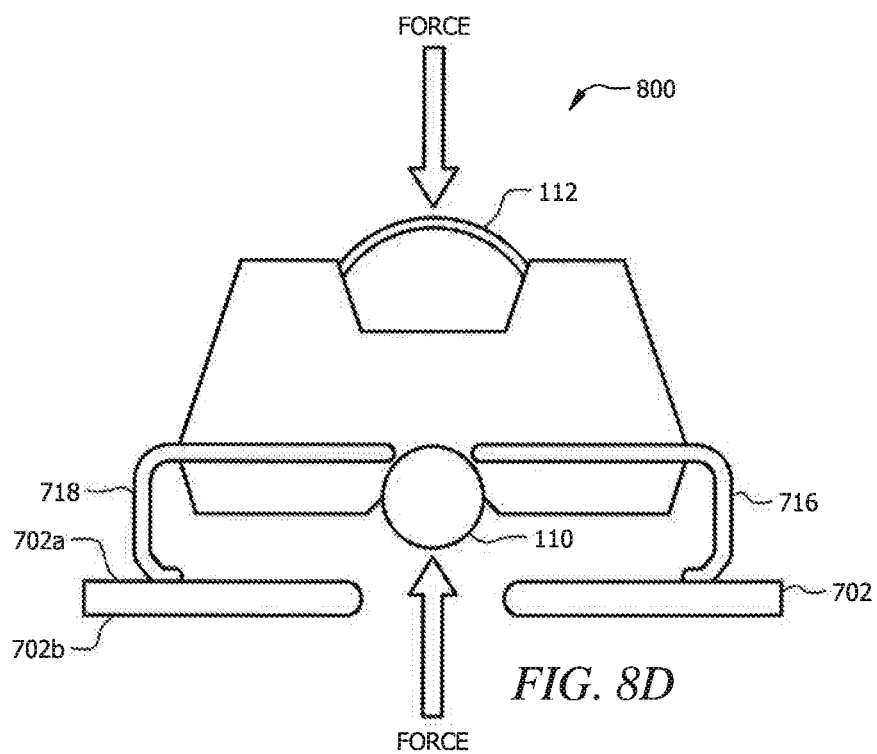

FIG. 8D illustrates another side view of a DIP package with the force sensor 800 coupled to the substrate 702. In this orientation, the port 802 is aligned with the first force sensor 110, and the leads 716, 718 are coupled to the first side 702a of the substrate 702. The port 802 can then provide access to the first actuation element 110 from the second side 702b of the substrate 702, and the second actuation element 112 can be accessed from the first side 702a of the substrate 702.

Each of the orientations shown in FIGS, 7A-8D illustrate the flexibility of the use of the force sensors described herein. By providing a single force sensor having one or more leads, the leads can be shaped as needed, and the force sensors can be coupled to a substrate in a number of orientations to provide a desired configuration as needed.

A method of preparing a sensor element according to one embodiment will now be described with reference to the force sensor packages of the illustrative embodiment shown in FIGS. 1A-5C. Initially, the leadframe 102, formed by techniques known in the art, is provided. Thereafter, the sense die 104, 204 can be positioned and coupled to the leadframe 102. For example, wire bonds and/or flip chip mounting can be used to electrically couple the sense die 104, 204 to the leadframe 102. Once the sense die 104, 204 is positioned, a molding operation can be used to cover the bonds, a portion of the leadframe 102, and a portion of the sense die 104, 204 with an encapsulant.

If processing circuitry is included, the processing circuitry can be electrically coupled to the leadframe 102 prior to the molding process, and all of the electrical connections can be established. The encapsulant can then cover the processing circuitry and corresponding electrical connections in addition to the wire bonds and portion of the sense die 104, 204.

The leads extending from the leadframe 102 can then be shaped to match the electrical connections on one or more substrates 702. The force sensor can then be positioned on the substrate and the electrical connections can be established. Any of the orientations and configurations described herein can be used to couple the force sensor on the substrate.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Having described various systems and methods herein, various embodiments can include, but are not limited to:

In a first embodiment, a force sensor comprises: a leadframe comprising a plurality of electrically conductive leads; a sense die coupled to the leadframe, wherein the sense die is electrically coupled to the plurality of leads; and an encapsulant disposed over at least a portion of the leadframe and the sense die, wherein the plurality of leads extends from the encapsulant, A second embodiment earl include the force sensor of the first embodiment, wherein the plurality of electrically conductive leads extends from one side of the leadframe.

A third embodiment can include the force sensor of the first embodiment, wherein the plurality of electrically conductive leads extends from two sides of the leadframe.

A fourth embodiment can include the force sensor of any of the first to third embodiments, wherein the sense die comprises a sense diaphragm configured to deflect to provide an indication of a force imposed on the sense diaphragm.

A fifth embodiment can include the force sensor of any of the first to fourth embodiments, wherein the sense die comprises a substantially uniform height across the sense die.

A sixth embodiment can include the force sensor of any of the first to fifth embodiments, further comprising a first actuation element disposed in contact with a first side of the sense die, wherein the first actuation element comprises a mechanical coupling element configured to mechanically couple an external force with the sense die.

A seventh embodiment can include the force sensor of the sixth embodiment, wherein the first actuation element comprises a spherical object, a pin, an extender, or a button.

An eighth embodiment can include the force sensor of the sixth or seventh embodiment, wherein the first actuation element is formed from a metal, a ceramic, a polymer, or any combination thereof.

A ninth embodiment can include the force sensor of any of the sixth to eighth embodiments, wherein the leadframe comprises an opening aligned with the first side of the sense die, wherein the first actuation element is disposed through the opening.

A tenth embodiment can include the force sensor of the ninth embodiment, wherein the first actuation element is snap fitted through the opening and retained between the opening and the first side of the sense die.

An eleventh embodiment can include the force sensor of any of the sixth to tenth embodiments, further comprising a second actuation element disposed in contact with a second side of the sense die.

A twelfth embodiment can include the force sensor of the eleventh embodiment, wherein the second actuation element comprises a gel.

A thirteenth embodiment can include the force sensor of the eleventh or twelfth embodiment, wherein the encapsulant defines a chamber aligned with the second side of the sense die, wherein the second actuation element is disposed within the chamber.

A fourteenth embodiment can include the force sensor of any of the first to thirteenth embodiments, wherein one or more of the plurality of electrically conductive leads is bent.

A fifteenth embodiment can include the force sensor of any of the first to fourteenth embodiments, wherein the encapsulant comprises a thermoplastic.

A sixteenth embodiment can include the force sensor of any of the first to fifteenth embodiments, wherein the sense die is electrically coupled to the plurality of leads using wire bonds.

A seventeenth embodiment can include the force sensor of any of the first to sixteenth embodiments, wherein the sense die is electrically coupled to the plurality of leads using flip chip mounting.

In an eighteenth embodiment, a force sensor comprises: a sense die comprising a first side and a second side; a first actuation element disposed in contact with the first side of the sense die, wherein the first actuation element comprises a mechanical coupling element configured to mechanically couple an external force with the sense die; and a second actuation element disposed in contact with the second side of the sense die, wherein the second actuation element comprises a gel.

A nineteenth embodiment can include the force sensor of the eighteenth embodiment, further comprising: a leadframe comprising a plurality of electrically conductive leads, wherein the sense die is disposed on the leadframe, and wherein the sense die is electrically coupled to the plurality of electrically conductive leads; and an encapsulant disposed over at least a portion of the leadframe and the sense die, wherein the plurality of leads extends from the encapsulant.

A twentieth embodiment can include the force sensor of the nineteenth embodiment, wherein the plurality of electrically conductive leads extends from one side of the leadframe, or two sides of the leadframe.

A twenty first embodiment can include the force sensor of the nineteenth or twentieth embodiment, wherein one or more of the plurality of electrically conductive leads is bent.

A twenty second embodiment can include the force sensor of any of the nineteenth to twenty first embodiments, wherein the encapsulant comprises a thermoplastic.

A twenty third embodiment can include the force sensor of any of the eighteenth to twenty second embodiments, wherein the sense die comprises a substantially uniform height across the sense die.

A twenty fourth embodiment can include the force sensor of any of the eighteenth to twenty third embodiments, wherein the first actuation element comprises a spherical object, a pin, an extender, or a button.

A twenty fifth embodiment can include the force sensor of any of the eighteenth to twenty fourth embodiments, wherein the first actuation element is formed from a metal, a ceramic, a polymer, or any combination thereof.

In a twenty sixth embodiment, a force sensor comprises: a leadframe comprising a plurality of electrically conductive leads; and a sense die coupled to the leadframe, wherein the sense die is electrically coupled to the plurality of electrically conductive leads, and wherein the sense die comprises a substantially uniform height across the sense die.

A twenty seventh embodiment can include the force sensor of the twenty sixth embodiment, further comprising: an encapsulant disposed over at least a portion of the leadframe and the sense die.

A twenty eighth embodiment can include the force sensor of the twenty sixth or twenty seventh embodiment, further comprising a first actuation element disposed in contact with a first side of the sense die, wherein the first actuation element comprises a mechanical coupling element configured to mechanically couple an external force with the sense die.

A twenty ninth embodiment can include the force sensor of the twenty eighth embodiment, wherein the first actuation element comprises a spherical object, a pin, an extender, or a button.

A thirtieth embodiment can include the force sensor of the twenty eighth or twenty ninth embodiment, wherein the first actuation element is formed from a metal, a ceramic, a polymer, or any combination thereof.

A thirty first embodiment can include the force sensor of any of the twenty eighth to thirtieth embodiments, wherein the leadframe comprises an opening aligned with the first side of the sense die, wherein the first actuation element is disposed through the opening.

A thirty second embodiment can include the force sensor of the thirty first embodiment, wherein the first actuation element is snap fitted through the opening and retained between the opening and the first side of the sense die.

A thirty third embodiment can include the force sensor of any of the twenty eighth to thirty second embodiments, further comprising a second actuation element disposed in contact with a second side of the sense die.

A thirty fourth embodiment can include the force sensor of the thirty third embodiment, wherein the second actuation element comprises a gel.

In a thirty fifth embodiment, a method comprises: disposing a sense die on a leadframe, wherein the leadframe comprises a plurality of electrically conductive leads; electrically coupling the sense die to the plurality of electrically conductive leads; and molding an encapsulant over at least a portion of the leadframe and the sense die.

A thirty sixth embodiment can include the method of the thirty fifth embodiment, wherein the encapsulant forms a chamber aligned with a first surface of the sense die, wherein the method further comprises: disposing a first actuation element in the chamber and in contact with the first surface of the sense die.

A thirty seventh embodiment can include the method of the thirty sixth embodiment, wherein disposing the first actuation element comprises dispensing a gel in the chamber.

A thirty eighth embodiment can include the method of the thirty sixth or thirty seventh embodiment, wherein the leadframe comprises an opening aligned with a second surface of the sense die, wherein the method further comprises: snap fitting a second actuation element through the opening and into contact with the second surface of the sense die.

A thirty ninth embodiment can include the method of any of the thirty fifth to thirty eighth embodiments, further comprising: shaping one or more of the electrically conductive leads to match a connection pattern on a substrate, wherein the connection pattern comprises a plurality of bond pads; and electrically coupling the electrically conductive leads to the plurality of bond pads.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification, and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should riot be constrained by the headings set forth herein.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A force sensor comprising:
    a leadframe comprising a plurality of electrically conductive leads;
    a sense die coupled to the leadframe, wherein the sense die is electrically coupled to the plurality of leads;
    an encapsulant disposed over at least a portion of the leadframe and the sense die, wherein the plurality of leads extends from the encapsulant;
    wherein the encapsulant is in contact with the leadframe and the sense die;
    a first actuation element disposed in contact with a first side of the sense die, wherein the first actuation element comprises a mechanical coupling element configured to mechanically couple an external force with the sense die; and
    a second actuation element disposed in contact with a second side of the sense die, wherein the second side is opposite to the first side, and wherein the second actuation element comprises a gel.

2. The force sensor of claim 1, wherein the sense die comprises a sense diaphragm configured to deflect to provide an indication of a force imposed on the sense diaphragm.

3. The force sensor of claim 1, wherein the sense die comprises a substantially uniform height across the sense die.

4. The force sensor of claim 1, wherein the first actuation element comprises a spherical object, a pin, an extender, or a button.

5. The force sensor of claim 1, wherein the first actuation element is formed from a metal, a ceramic, a polymer, or any combination thereof.

6. The force sensor of claim 1, wherein the leadframe comprises an opening aligned with the first side of the sense die, wherein the first actuation element is disposed through the opening.

7. The force sensor of claim 6, wherein the first actuation element is snap fitted through the opening and retained between the opening and the first side of the sense die.

8. A force sensor comprising:
    a sense die comprising a first side and a second side;
    a first actuation element disposed in contact with the first side of the sense die, wherein the first actuation element comprises a mechanical coupling element configured to mechanically couple an external force with the sense die; and
    a second actuation element disposed in contact with the second side of the sense die, wherein the second actuation element comprises a gel;
    wherein the second side is opposite to the first side.

9. The force sensor of claim 8, further comprising:
    a leadframe comprising a plurality of electrically conductive leads, wherein the sense die is disposed on the leadframe, and wherein the sense die is electrically coupled to the plurality of electrically conductive leads; and
    an encapsulant disposed over at least a portion of the leadframe and the sense die, wherein the plurality of leads extends from the encapsulant.

10. The force sensor of claim 9, wherein the plurality of electrically conductive leads extend from one side of the leadframe, or two sides of the leadframe.

11. The force sensor of claim 9, wherein one or more of the plurality of electrically conductive leads is bent.

12. The force sensor of claim 9, wherein the encapsulant comprises a thermoplastic.

13. The force sensor of claim 9, wherein the sense die comprises a substantially uniform height across the sense die; wherein the encapsulant is in contact with the leadframe and the sense die.

14. A method comprising:
    disposing a sense die on a leadframe, wherein the leadframe comprises a plurality of electrically conductive leads;
    electrically coupling the sense die to the plurality of electrically conductive leads;
    molding an encapsulant over at least a portion of the leadframe and the sense die;
    wherein the encapsulant is in contact with the leadframe and the sense die;
    disposing a first actuation element in contact with a first side of the sense die, wherein the first actuation element comprises a mechanical coupling element configured to mechanically couple an external force with the sense die; and
    disposing a second actuation element in contact with a second side of the sense die, wherein the second side is opposite to the first side, and wherein the second actuation element comprises a gel.

15. The method of claim 14, wherein the encapsulant forms a chamber aligned with the second side of the sense die, wherein the second actuation element is disposed in the chamber.

16. The method of claim 15, wherein the leadframe comprises an opening aligned with the first side of the sense die, wherein the method further comprises:
    snap fitting the first actuation element through the opening and into contact with the first side of the sense die.

17. The method of claim 14, further comprising:
shaping one or more of the electrically conductive leads to match a connection pattern on a substrate, wherein the connection pattern comprises a plurality of bond pads; and
electrically coupling the electrically conductive leads to the plurality of bond pads.

\* \* \* \* \*